United States Patent [19]

Hosokawa

[11] Patent Number: 5,445,554
[45] Date of Patent: Aug. 29, 1995

[54] METHOD FOR CHAMFERING NOTCH OF WAFER AND APPARATUS THEREFOR

[75] Inventor: Kaoru Hosokawa, Saitama, Japan
[73] Assignee: Shin-Etsu Handotai Co., Ltd., Tokyo, Japan
[21] Appl. No.: 215,046
[22] Filed: Mar. 8, 1994

Related U.S. Application Data

[63] Continuation of Ser. No. 897,288, Jun. 11, 1992, abandoned.

[30] Foreign Application Priority Data

Jun. 12, 1991 [JP] Japan .................................. 3-167752

[51] Int. Cl.⁶ .............................................. B24B 49/00
[52] U.S. Cl. ........................................ 451/11; 451/14; 451/246; 451/41; 451/44
[58] Field of Search ............ 51/283 R, 283 E, 165.77, 51/165.8, 165 R, 105 R, 105 SP

[56] References Cited

U.S. PATENT DOCUMENTS

| | | | |
|---|---|---|---|
| 4,753,049 | 6/1988 | Mori | 51/131.5 |
| 4,905,425 | 3/1990 | Sekigawa | 51/165.77 |
| 5,036,624 | 8/1991 | Steere, Jr. | 51/165.71 |

*Primary Examiner*—Bruce M. Kisliuk
*Assistant Examiner*—Eileen P. Morgan
*Attorney, Agent, or Firm*—Townsend & Banta

[57] ABSTRACT

A notch of a wafer is chamfered by a method which is characterized by disposing a rotary disklike grindstone and a wafer to be ground with the disklike grindstone in such a manner that the surfaces thereof intersect each other, relatively moving the grindstone and the wafer toward or away from each other, and meanwhile rotating the wafer within a prescribed angle around the central axis perpendicular to the surface of the wafer thereby effecting a work of chamfering the notch of the wafer in the circumferential direction and/or in the direction of thickness of the wafer.

The chamfering is accomplished with an apparatus which comprises a rotating disklike grindstone, a wafer retaining mechanism capable of disposing a wafer and the grindstone in such a manner that the surfaces thereof intersect each other and, at the same time, retaining the wafer in such a manner as to be rotated around the central axis perpendicular to the surface of the wafer, a first drive mechanism for relatively moving the grindstone and the wafer toward or away from each other, a second drive mechanism for relatively moving the grindstone and the wafer in the direction of thickness of the wafer, and a control circuit capable of controlling the motions of the wafer retaining mechanism, the first drive mechanism, and the second drive mechanism thereby effecting the work of chamfering the notch of the wafer in the circumferential direction and or in the direction of thickness of the wafer.

2 Claims, 3 Drawing Sheets

METHOD FOR CHAMFERING NOTCH OF WAFER AND APPARATUS THEREFOR

This application is a file wrapper continuation of application Ser. No. 07/897,288, filed Jun. 11, 1992 now abandoned.

BACKGROUND OF THE INVENTION

1. Field of the Invention

This invention relates to a method for chamfering a notch of a semiconductor wafer while keeping the wafer in implane self rotation and an apparatus for executing the method.

2. Description of the Prior Art

On account of effective application of photolithography, it has been customary for wafers such as semiconductor wafers to have an orientation flat (hereinafter referred to as "OF") formed thereon by grinding off to leave a short linear cut in part of the periphery of a wafer thereby facilitating correct positioning of the wafer on an exposure device.

The formation of the OF, however, inevitably results in removal of a large portion of the wafer. Particularly in the production of wafers of a large diameter, the cumulative amount of portions wasted by this removal is so large as to impair the yield of products conspicuously. The fact that this impaired yield prevents expensive semiconductor wafers from being efficiently utilized has posed a problem.

In the circumstances, the practice of imparting a notch substantially in the shape of the letter V or substantially in the shape of an arc to the periphery of a given wafer has come to prevail for the purpose of efficiently utilizing produced wafers. Particularly the V-shaped notches have been finding extensive utility by reason of their outstanding accuracy of positioning.

Since the wafers are destined to be conveyed a number of times on production lines as in the process for manufacture of devices, their peripheries are possibly subject to chippings on colliding with parts of equipment used in the manufacturing process and the produced semiconductor consequently suffer from degradation of characteristic properties. It has been customary, therefore, for the wafers to have their whole peripheral parts chamfered.

The wafers furnished with a notch as described above, however, have found no adaptability for any work of conventional chamfering technique because the notch is small in size as compared with the peripheral length of a wafer. As the semiconductor IC's have gained in number of components per chip, however, they come to entail the drawback that the notches of their wafers cause chippings when the wafers are positioned in the process of device production by aligning the notch to a pin of rigid material. Since sharp edges of the wafers are not easily removed by machining, the removal to be made at all adds conspicuously to occurrence of dust and the effort to preclude infliction of chippings fails. This fact has posed a problem too serious to be ignored.

This invention, initiated in the light of this problem, has for an object thereof the provision of a method for chamfering a notch of a wafer, which method is capable of easily and accurately chamfering a sharp edge such as of the notch and enabling the work of chamfering the notch to be carried out in high efficiency and an apparatus for executing the method.

SUMMARY OF THE INVENTION

To accomplish the object described above, this invention contemplates a method which is characterized by disposing a rotary disklike grindstone and a wafer to be ground with the disklike grindstone in such a manner that the surfaces thereof intersect each other, relatively moving the grindstone and the wafer toward or away from each other in directions of a diameter or thickness of the wafer, and meanwhile rotating the wafer within a prescribed angle around the central axis perpendicular to the surface of the wafer thereby chamfering the notch of the wafer in the circumferential direction.

This invention further contemplates an apparatus which comprises a rotating disklike grindstone, a wafer retaining mechanism capable of disposing a wafer and the grindstone in such a manner that the surfaces thereof intersect each other and, at the same time, retaining the wafer in such a manner as to be rotated around the central axis perpendicular to the surface of the wafer, a first drive mechanism for relatively moving the grindstone and the wafer toward or away from each other in the centre-to-centre direction, a second drive mechanism for relatively moving the grindstone and the wafer in the direction of thickness of the wafer, and a control circuit capable of controlling the motions of the wafer retaining mechanism, the first drive mechanism, and the second drive mechanism thereby effecting the work of chamfering the notch of the wafer in the circumferential direction of the notched part and/or in the direction of thickness of the wafer.

DETAILED DESCRIPTION OF THE PREFERRED EMBODIMENTS

Figure 1:
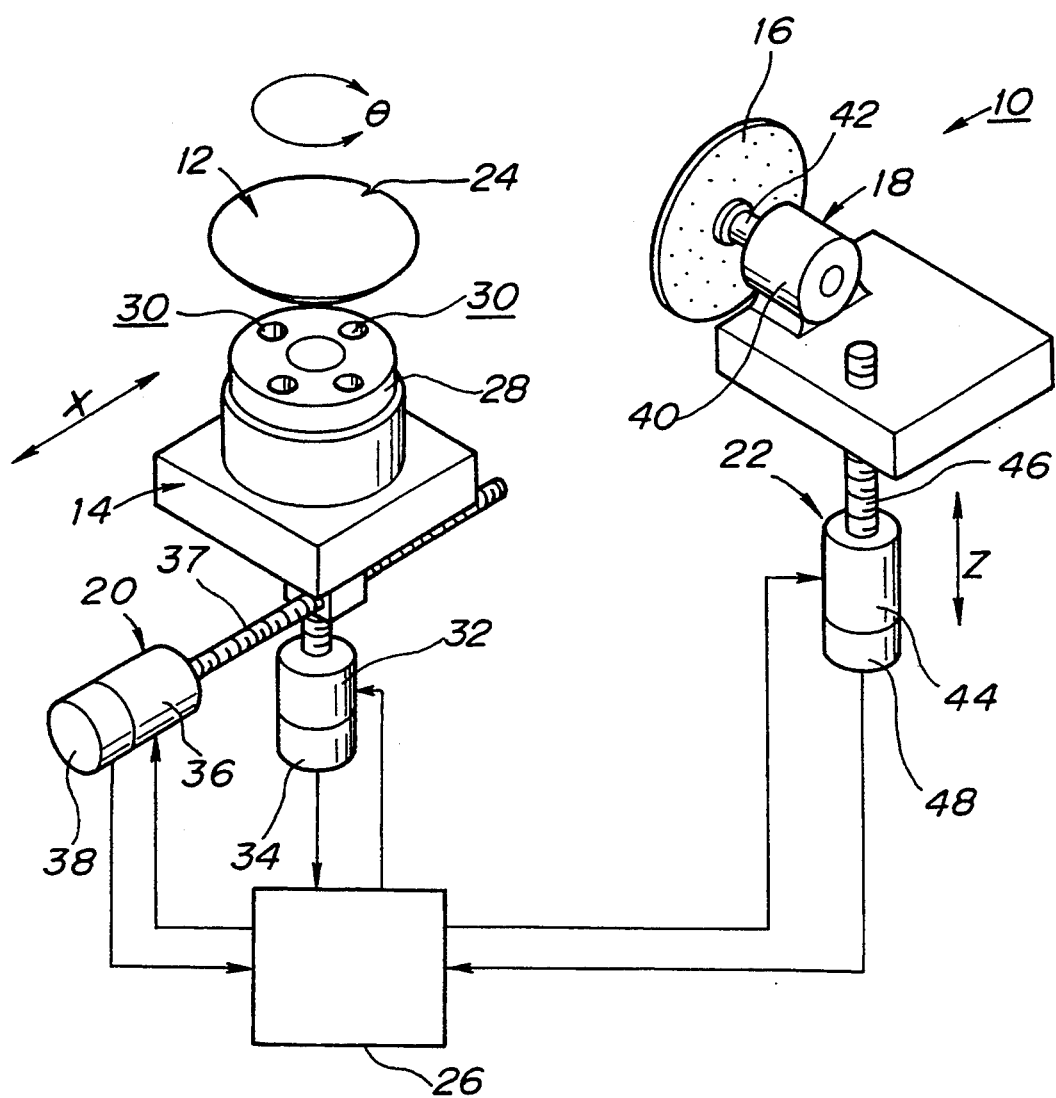
FIG. 1 is a perspective explanatory diagram of an apparatus of this invention for chamfering a notch of a wafer.

The method for chamfering the notch of a wafer contemplated by this invention as described above comprises relatively moving the disklike grindstone and the wafer toward or away from each other and meanwhile rotating the wafer within a specific range of angle around the central axis thereof perpendicular to the surface thereof and, therefore, is capable of accurately and easily positioning the notch of a particularly small size relative to the position of grinding when the grindstone is brought into contact with the grinding position and performing a highly accurate and efficient chambering work throughout the entire inner periphery of the notched part. Moreover, since the relative shift of the grinding position of the wafer and the grindstone in the direction of thickness of the wafer enables the chamfering work to be performed across the entire thickness of the wafer throughout the entire inner periphery of the notched part mentioned above, the chamfering is completed throughout the entire length of the upper and lower edged portions of the inner periphery of the notched part.

The shape of the notch is selected from among the shape of the letter V, the shape of a circle, and other shapes similar thereto on the same plane as the surface of the wafer. In the case of a V-shaped notch, for example the bottom of the letter V constitutes itself a round part and the upper edged portions thereof and the two joints formed of between the intersection of the inner periphery of the letter V and the periphery of the wafer body, each of the joints similarly constituting a round, where the rounding of the joints is the same as with the lower edged portion. The notch of this construction can be chamfered completely in the inner peripheral direction by the relative motion of the wafer and the grindstone toward or away from each other and the rotation of the wafer within the prescribed angle mentioned above.

The disklike grindstone has a laterally circular shape and produces a symmetrical rotation around the center thereof. The cross section of the leading terminal of the grindstone inclusive of the radius has the shape of the letter V. This R is in certain cases smaller than or equal to the R of the round part of the V-shaped bottom of the notch of the wafer mentioned above. The reason for this particular size of the R is that the V-shaped bottom part of the notched part is machined easily.

The diameter of the disklike grindstone is desired to be as large as permissible because the chamfering work forms a slight concave surface in the chamfered surface of the notch of the wafer. In the execution of this invention, the diameter may be smaller on the condition that the shift of the machining position in the direction of thickness of the wafer is decreased in each step to an extremely small extent. Optionally, after the chamfering work of this invention is completed, the chamfered inner surface of the notch may be polished to added smoothness by the work of buffing or etching, for example.

At least inner an surface of the notch can be chamfered only in the inner peripheral direction by retaining the disklike grindstone practically at a fixed position and by selecting a proper angle formed by two side of the V-shaped part, and a radius of the round part in the cross section of the leading terminal of the grindstone, and rotating only the wafer in both ways of a same direction within a prescribed angle around the central axis perpendicular to the surface of the wafer.

The round parts formed along the joints between the opening of the notch and the periphery of the wafer can be chamfered by the use of a separately prepared grindstone which has an arcuate depression on the peripheral working surface thereof.

Though this invention is described as residing only in chamfering the notch of a wafer which has this notch formed in advance of the chambering work, it embraces the chamfering which is effected simultaneously with formation of the notch.

Besides, the apparatus of this invention for chamfering the notch of a wafer is capable of highly accurately and efficiently chamfering the notch in the circumferential direction and/or in the direction of thickness of the wafer in conformity with the contour of the notch because the first drive mechanism for relatively moving forwardly and backwardly the grindstone and the wafer in the radial direction of the grindstone and the second drive mechanism for relatively moving forwardly and backwardly the grindstone and the wafer in the direction of thickness of the wafer are driven and controlled through the medium of the control circuit.

The method of this invention for chamfering the notch of a wafer and the apparatus for performing the method will be described below with reference to accompanying drawings illustrating embodiments of this invention.

In FIG. 1, the reference numeral 10 stands for an apparatus of the present embodiment for chamfering the notch of a wafer. This notch-chamfering apparatus 10 is provided with a wafer-retaining mechanism 14 for retaining a wafer 12 rotatably (.in the direction of the arrow $\theta$) around the central axis perpendicular to the main surface thereof, a rotary drive mechanism 18 for positioning a disklike grindstone 16 in such a manner that the surface thereof intersects (perpendicularly in the illustrated embodiment) the surface of the wafer 12, a first drive mechanism 20 provided in the wafer-retaining mechanism 14 for causing the wafer 12 to be moved forwardly and backwardly relative to the grindstone 16 in the radial direction (in the direction of the arrow X) of the wafer 12, a second drive mechanism 22 provided in the rotary drive mechanism 18 for causing the grindstone 16 to be moved forwardly and backwardly relative to the wafer 12 in the direction of thickness of the wafer 12 (in the direction of the arrow Z), and a control circuit 26 for driving and controlling the wafer-retaining mechanism 14, the first drive mechanism 20, and the second drive mechanism 22 thereby chamfering the notch 24 of the wafer 12 in the circumferential direction and in the direction of thickness of the wafer.

The wafer-retaining mechanism 14 is provided with a rotary base 28. In the upper part of the rotary base 28 are formed a plurality of suction holes 30 which communicates with an unshown vacuum pump and serves the purpose of attracting the wafer 12 by suction. The rotary base 28 is interlocked to a pulse motor 32 as a servo motor. To this pulse motor 32 is attached a rotary encoder 34 which detects the revolution number of the pulse motor 32 and feeds to the control circuit 26 the information about the angular position of the direction of the arrow $\theta$ of the wafer 12 retained by the wafer-retaining mechanism 14.

Figure 2:
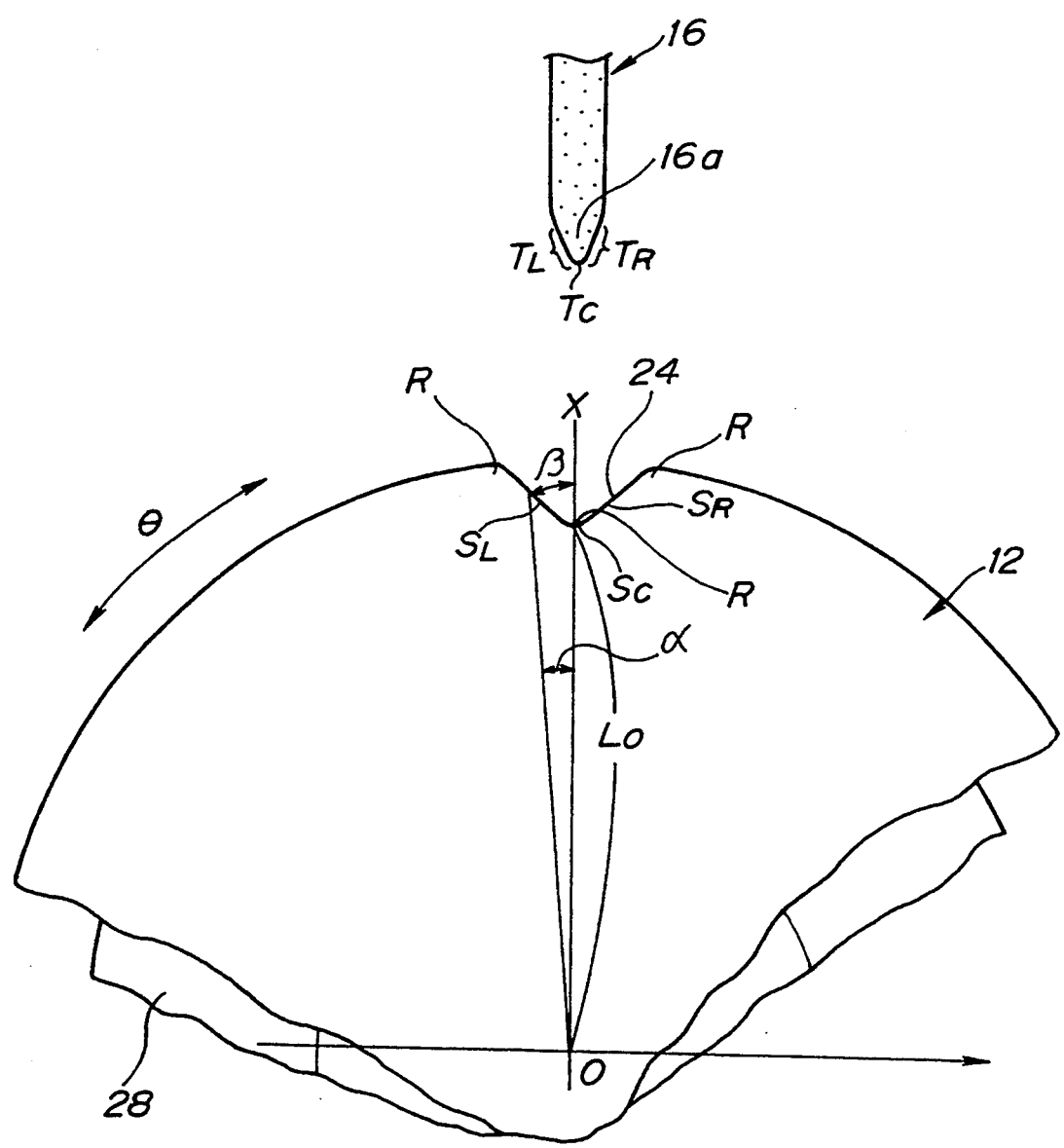
FIG. 2 is a magnified explanatory diagram of a roughly V-shaped notch of a wafer.

The grindstone 16 is required to have a wall thickness prescribed on account of such factors as strength and is desired to be thin enough to allow effective grinding of the notch 24 which is appreciably small in size. The grindstone 16 can perform advantageously the chamfering of the notch 24 while retaining desired strength intact when the leading terminal part 16a thereof (which is utilized for actual grinding) is formed in a forwardly converging cross section (as illustrated in FIG. 2). Here, the question as to what part of the grindstone formed in the forwardly converging cross section contacts the wafer and grinds it will be reviewed. In the chamfering of one of the slanted parts, $S_L$, of the V-shaped notch, the part of the grindstone 16 from one of the slanted parts, $T_L$, through the central part, $T_c$, of the leading terminal comes into contact with the wafer and produces the desired grinding thereof. As respects the most recessed part of the V-shaped notch, the central part, $T_c$, of the leading terminal of the grindstone 16 fulfills the role of grinding the waver. In the chamfering of the other slanted part, $S_R$, of the V-shaped notch, the part of the grindstone 16 from the central part, $T_c$, of the leading terminal through the other slanted part, $T_R$, grinds the chamfered part of the wafer. In the manner described above, the leading terminal part 16a of the grindstone 16 effects the operation of grinding. When the leading terminal part of the grindstone has no forwardly converged cross section, the grindstone fails to give disired grinding to the recessed central part, $S_c$, of the V-shaped notch unless overall thickness of the grindstone is extremely small. If the grindstone is given such a small overall thickness, the grindstone encounters difficulty in retaining the required strength as already pointed out above.

The first drive mechanism 20 is provided with a pulse motor 36. A feed screw 37 connected to the rotary shaft of this pulse motor 36 is interlocked with the wafer-retaining mechanism 14. To the pulse motor 36 is attached a rotary encoder 38 which serves the purpose of detecting the number of revolutions of the pulse motor 36 and feeding to the control circuit 26 the information on the position of the wafer 12 retained by the wafer-retaining mechanism 14 relative to the direction of the arrow X.

The rotary drive mechanism 18 is provided with an electric motor 40. The grindstone 16 is fixed to a rotary shaft 42 of the electric motor 40. To this rotary drive mechanism 18 is interlocked a feed screw 46 which is connected to a pulse motor 44 forming the second drive mechanism 22. To this pulse motor 44 is attached a rotary encoder 48 which serves the purpose of detecting the number of revolutions of the pulse motor 44 and feeding to the control circuit 26 the information on the position of the grindstone 16 relative to the direction of the arrow Z.

The control circuit 26 drives and controls the entire notch chamfering apparatus 10 and, at the same time, computes the amounts of motions in the directions of the arrows $\theta$, X, and Z in accordance with an arithmetic expression or data stored in a memory (not shown) in conformity to the shape and other factors of the notch 24 of the wafer 12, as will be described below.

Now, the operation of the notch chamfering apparatus 10 constructed as explained above will be described below in relation to the method of chamfering the notch in the present embodiment.

Figure 3:
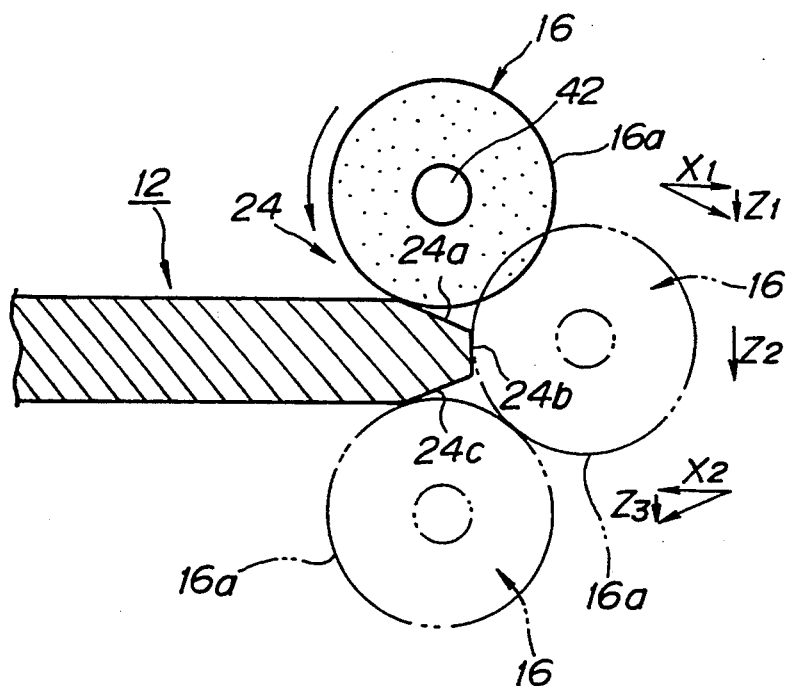
FIG. 3 is an explanatory diagram of chamfering work being performed on a notch.

First, the disklike wafer 12 is placed on the rotary base 28 forming the wafer-retaining mechanism 14 and is attracted by suction to the rotary base 28 through the medium of the suction holes 30 under the operation of an vacuum pump not shown. After the notch 24 of the wafer 12 and the grindstone 16 have been positioned in such a manner that the surfaces thereof intersect each other, the control circuit 26 issues a drive signal to the pulse motors 32 and 36. The rotary base 28 is rotated at a prescribed speed in the direction of the arrow $\theta$ by the action of the pulse motor 32 and, at the same time, the feed screw 37 is rotated by the action of the pulse motor 36, with the result that the wafer-retaining mechanism 14 is moved forwardly and backwardly in the direction of the arrow X. In the meantime, the grindstone 16 is rotated through the medium of the rotary shaft 42 by the driving action of the electric motor 40. As a result, the wafer 12 and the grindstone 16 in rotation are relatively moved toward and away from each other and the wafer 12 is rotated in the direction of the arrow $\theta$ to exert a chamfering action on part of the circumferential direction of an angular part 24a of the notch 24 of the wafer 12 (as illustrated in FIG. 3).

In this case, the shape of the notch 24 can be selected from among approximate shapes of the letter V, approximately arcuate shapes, approximately parabolic shapes, etc. When this notch 24 has the shape of the letter V as illustrated in FIG. 2, for example, the relation of the following equation exists between the distance of motion in the direction of the arrow X and the angle $\alpha$ of rotation:

$$X(\alpha) = \frac{L_0(1 - \cos\alpha + \tan(\pi/2 - \beta)\sin\alpha)}{\cos\alpha - \tan(\pi/2 - \beta)\sin\alpha}$$

wherein $\alpha$ stands for the angle of rotation, $\beta$ for one half of the degree of opening of the V groove in the notch 24, and $L_0$ for the distance from the origin 0 to the starting point of motion.

In accordance with the arithmetic expression, the control circuit 26, therefore, computes the amount of rotation of the wafer 12 in the direction of the arrow $\theta$ and the amount of motion of the wafer 12 in the direction of the arrow X and issues a drive singnal to the pulse motors 32 and 36. As a result, the chamfering work is performed on the inner peripheral surface of the notch 24 and, at the same time, the chamfering work using the aforementioned amounts of rotation and motion computed in accordance with the prescribed arithmetic expression, for example, is performed on the edged portions of the inner periphery of the notch 24, consequently rounding is imparted to the innermost recess of the notch, and to the joints at the outermost of the opening of the notch with the outer periphery of the wafer. Here, the numbers of revolutions of the pulse motors 32 and 36 are detected through the medium of the rotary encoders 34 and 38 and introduced into the control circuit 26 to induce feedback of the relative positions of the wafer 12 and the grindstone 16.

The grindstone 16, while performing the chamfering work on the notch 24 in the direction of length of the angular part 24a of the inner periphery thereof, is moved at a relatively low speed or in minute increments along the arrow mark of the direction of thickness of the wafer along the angular part 24a of the inner periphery as shown in FIG. 3. To be specific, when the control circuit 26 issues a drive signal to the pulse motor 44 forming the second drive mechanism 22, a feed screw 46 is rotated in the prescribed direction through the medium of this pulse motor 44 and the rotary drive mechanism 18 interlocked with this feed screw 46 is slowly moved in the direction of the arrow $Z_1$. Synchronously with this motion, the pulse motor 36 is driven and the grindstone 16 and the wafer 12 are relatively moved in the direction of the arrow $X_1$ and the grindstone 16 is positioned correspondingly to the angular part 24a of the inner periphery. After the chamfering work to be performed on a certain limited part in the direction of the wafer thickness across the whole length of the periphery of the angular part 24a of the inner periphery as described above has been completed, therefore, the chamfering work in the direction of length of the other part of the periphery of the angular part 24a of the inner periphery is continuously performed as synchronized with the rotation in the direction of the arrow $\theta$.

Owing to the fact that the leading terminal part 16a of the grindstone 16 effects continuous grinding on the angular part 24a of the inner periphery at prescribed intervals in the direction of thickness of the wafer in the manner described above, the angular part 24a of the inner periphery is ground advantageously in the shape of a flat surface or in the shape of a outwardly curved surface with a radius in the cross section taken in the direction of thickness of the wafer and the angular part 24a of the inner periphery is not worked to recess in conformity with the contour of the leading terminal part 16a. Here, the choice between forming the chamfered part in the shape of a flat surface and forming it in the shape of a curved surface with a radius in the cross section taken in the direction of thickness of the wafer can be freely made by means of an arithmetic expression or data.

Then, on the angular part 24c of the inner periphery of the wafer 12 and the perpendicular part 24b of the inner periphery of the wafer 12, the continuous grinding work is similarly performed a plurality of times at prescribed intervals in the neighborhood of the joint between the angular parts 24a and 24c of the inner periphery. Here, the grindstone 16 is moved in the direction of the arrow $Z_2$ while the peripheral part 24b is being chamfered, whereas the grindstone 16 and the wafer 12 are moved relatively in the directions of the arrows $X_2$ and $Z_3$ while the angular part 24c is being chamfered. The operation described above brings about the effect of continuously and efficiently producing the chamfering work in the circumferential direction of the wafer 12 and in the direction of thickness of the wafer.

In the present embodiment, the wafer 12 is rotated in the direction of the arrow $\theta$ through the medium of the wafer-retaining mechanism 14 and, at the same time, it is moved forwardly and backwardly in the direction of the arrow X through the medium of the first drive mechanism 20. As a result, the leading terminal part 16a forming the grinding surface of the grindstone 16 can be accurately guided in conformity to the contour of the notch 24 so as to perform the chamfering work with high accuracy on the inner peripheral surface of the notch 24. Particularly since the notch 24 has an appreciably small size as compared with the size of the wafer 12, the rotation of the wafer 12 to be produced within a prescribed range of angle in the direction of the arrow $\theta$ brings about the effect of obtaining highly accurate and infallible removal of sharp edges quickly. Moreover, even when the shape of the notch 24 is changed to an approximately arcuate shape or to an approximately parabolic shape, the chamfering work of the notch 24 can be carried out efficiently without requiring interchange of grindstones 16.

The present embodiment has been discribed as performing the grinding work as split into a plurality of portions on the angular parts 24a and 24c of the inner periphery of the notch 24 and the perpendicular part 24b of the inner periphery of the wafer as illustrated in FIG. 3. When the grindstone 16 to be used is given an appreciably large diameter, the number of rounds of grinding to be performed in parts other than the joints between the part 24b and the part 24a, and the joints between the part 24b and the part 24c can be notably decreased. When the chamfering work is followed by such a supplementary work as buffing or chemical etching, slightly dented surfaces of the parts 24a and 24c can be flattened or converted into slightly roughed surfaces.

Figure 4:
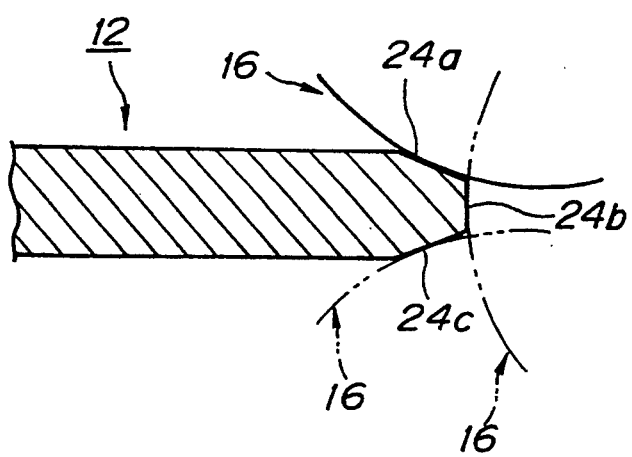
FIG. 4 is an explanatory diagram of chamfering work being performed on a notch.

Owing to the use of the grindstone 16 of such a large diameter as described above, the angular parts 24a and 24c and the peripheral part 24b of the notch 24 can be severally ground into flat surfaces by one round of chamfering as illustrated in FIG. 4.

The present embodiment has been described with respect to the case in which the chamfering work of the entire notch 24 is obtained by moving the grindstone 16 in the direction of thickness of the wafer 12 (in the direction of the arrow Z) while the chamfering work is being continued in the direction of length of the inner periphery of the notch 24. It is permissible, conversely, to effect the chamfering work by moving the grindstone 16 and the wafer 12 in the direction of length of the inner periphery of the wafer 12 while the chamfering work is being continued in the direction of thickness of the inner wall of the notch 24.

Specifically, by synchronously driving and controlling the first drive mechanism 20 and the second drive mechanism 22, the wafer 12 is moved in the direction of the arrow X and the grindstone 16 is moved in the direction of the arrow Z to produce the chamfering work on part of the notch 24 in the direction of thickness of the wafer and, at the same time, induce rotational drive of the pulse motor 32 at a relatively low speed, and consequently causes the wafer 12 to be slowly rotated around the central axis thereof (in the direction of the arrow $\theta$). As a result, the grindstone 16 is enabled to chamfer the notch 24 in the direction of thickness of the wall and meanwhile continue this chamfering work on the notch 24 in the circumferential direction.

The method and apparatus of this invention for chamfering the notch of a wafer produce the following effects.

Since the wafer is rotated within a prescribed range of angle around the central axis thereof while the grindstone and the wafer are moved toward and away from each other, the notch which is appreciably small as compared with the size of the wafer can be positioned accurately relative to the grindstone and the chamfering work can be carried out highly accurately and efficiently on the notch in the circumferential direction and/or in the direction of thickness of the wafer.

Moreover, a change in the shape of the notch does not require interchange of grindstones but can be easily coped with by only changing the amount of angle of rotation of the wafer and the amount of relative motion of the wafer and grindstone. Thus, this invention has the advantage that the chamfering work can be efficiently performed on the notch of a varying shape.

What is claimed is:

1. A method for chamfering a surface and edges of a notch in a wafer, said wafer having substantially parallel planar surfaces which are perpendicular to a central axis of the wafer, said wafer having a peripheral edge surface, said wafer having a notch with a vertex, said notch being at the peripheral edge surface of the wafer, said notch having a first surface extending between said parallel planar surfaces, first and second edges of said notch being formed at junctures of said first surface and said parallel planar surfaces, which method comprises the steps of:

positioning relative to a wafer to be ground a rotating thin grindstone in the shape of a disk and having an edge portion and substantially parallel planar surfaces so that one of the planar surfaces of the grindstone intersects one of said planar surfaces of said wafer at a first edge of the notch, chamfering said wafer along said first edge of said notch by relatively moving said rotating grindstone and said wafer parallel toward or away from each other in a direction parallel to one of said wafer planar surfaces and at the same time rotating said wafer a small prescribed angle around its central axis perpendicular to said planar surfaces of said wafer, thereby to chamfer said first edge of said notch, chamfering said wafer along said first surface of said notch by relatively moving said rotating grindstone and said wafer toward or away from each other in a direction parallel to said parallel planar surfaces of the wafer, and chamfering said wafer along said second edge of said notch by relatively moving said rotating grindstone and said wafer toward or away from each other in a direction parallel to one of said parallel planar surfaces while at the same time rotating said wafer a prescribed angle around its central axis perpendicular to said planar surfaces of said wafer, thereby to chamfer said second edge of said notch.

2. A method for chamfering a surface and edges of a notch in a wafer, said wafer having substantially parallel planar surfaces which are perpendicular to a central axis of the wafer, said wafer having a peripheral edge surface, said wafer having a notch with a vertex, said notch being at a peripheral edge surface of the wafer, said notch having a first surface extending between said parallel planar surfaces and first and second edges formed at junctures of said first surface and said parallel planar surfaces, which method comprises the steps of:

positioning relative to a wafer to be ground a rotating thin grindstone in the shape of a disk having an edge portion and substantially parallel planar surfaces so that one of the planar surfaces of the grindstone intersects a planar surface of said wafer, chamfering said wafer along a segment of said first surface and said first and second edges of the notch by relatively moving said rotating grindstone and said wafer toward or away from each other in a direction perpendicular to said parallel planar surface of the wafer and, at the same time, slowly rotating said wafer a small prescribed angle around its central axis perpendicular to said planar surfaces of said wafer, and relatively moving said rotating grindstone and said wafer toward or award from each other in a radial direction of the grindstone, then chamfering said wafer along another segment of said first surface and said first and second edges of the notch by relatively moving said rotating grindstone and said wafer toward or away from each other in a direction perpendicular to said parallel planar surfaces of the wafer, while at the same time relatively moving the wafer and rotating grindstone toward or away from each other in a radial direction of said wafer while at the same time slowly rotating said wafer a small prescribed angle around its central axis perpendicular to the planar surfaces of the wafer.

* * * * *